(12) United States Patent
Kato (10) Patent No.: US 10,662,530 B2
(45) Date of Patent: May 26, 2020

(54) SUPPORT PIN AND FILM DEPOSITION DEVICE

(71) Applicant: Sakai Display Products Corporation, Osaka (JP)

(72) Inventor: Hisayuki Kato, Osaka (JP)

(73) Assignee: Sakai Display Products Corporation (JP)

( * ) Notice: Subject to any disclaimer, the term of this patent is extended or adjusted under 35 U.S.C. 154(b) by 191 days.

(21) Appl. No.: 15/880,073

(22) Filed: Jan. 25, 2018

(65) Prior Publication Data

US 2018/0171474 A1    Jun. 21, 2018

Related U.S. Application Data

(63) Continuation-in-part of application No. PCT/JP2015/071549, filed on Jul. 29, 2015.

(51) Int. Cl.
| | |
|---|---|
| *C23C 16/458* | (2006.01) |
| *H01L 21/687* | (2006.01) |
| *C23C 16/509* | (2006.01) |

(52) U.S. Cl.
CPC ...... *C23C 16/4583* (2013.01); *C23C 16/4585* (2013.01); *C23C 16/4586* (2013.01); *C23C 16/5096* (2013.01); *H01L 21/68742* (2013.01)

(58) Field of Classification Search
CPC .............. C23C 16/4581–4583; C23C 16/4586
See application file for complete search history.

(56) References Cited

U.S. PATENT DOCUMENTS

| | | | |
|---|---|---|---|
| 6,319,569 B1* | 11/2001 | Callaway | C23C 14/541 118/723 EB |
| 2003/0205329 A1* | 11/2003 | Gujer | C23C 16/405 156/345.51 |

FOREIGN PATENT DOCUMENTS

| | | |
|---|---|---|
| JP | 2012087336 A | 5/2012 |
| JP | 2012237026 A | 12/2012 |

\* cited by examiner

*Primary Examiner* — Dah-Wei D. Yuan
*Assistant Examiner* — Stephen A Kitt
(74) *Attorney, Agent, or Firm* — St. Onge Steward Johnston & Reens, LLC (57) ABSTRACT

The support pin has a head supporting a substrate and a support cylinder supporting the head. Through-holes through which a coupling member for coupling the head and the support cylinder is inserted are respectively provided in the head and the support cylinder. The support pin is disposed in a reaction chamber of the film deposition device forming a film on the substrate. The head has a placing part on which the substrate is placed and an insertion part protruding from the placing part and inserted into an end of the support cylinder. The insertion part has a pair of first portions that are received by end portions of a pair of grooves of the support cylinder and a second portion that is located inside the support cylinder and is continuous with the pair of first portions.

16 Claims, 6 Drawing Sheets

FIG.8

SUPPORT PIN AND FILM DEPOSITION DEVICE

CROSS-REFERENCE TO RELATED APPLICATION

This is a continuation-in-part of PCT international application No. PCT/JP2015/071549 filed on Jul. 29, 2015, incorporated herein by reference.

BACKGROUND OF THE INVENTION

The present invention relates to a support pin supporting a substrate and a film deposition device forming a film on a substrate supported by the support pin.

BACKGROUND ART

Conventionally, film deposition devices for forming a film on a substrate, e.g., a chemical vapor deposition (CVD) device, have been proposed (see, for example, JP 2012-237026 A). A film deposition device has a reaction chamber and a susceptor disposed in the reaction chamber and supporting a substrate. The susceptor is configured to be vertically movable and has a plurality of through-holes vertically penetrating it. A support pin provided at the bottom of the reaction chamber is inserted into each through-hole.

The film deposition is performed as follows. The susceptor is lowered, and an upper part of the support pin is positioned above the susceptor. A transfer device transfers the substrate to the reaction chamber, and the support pin supports the transferred substrate. The susceptor is elevated and supports the substrate. A gas is supplied into the reaction chamber to form a film on the substrate.

The support pin has a vertically extending support cylinder and a head inserted into an upper end part of the support cylinder. Each of the head and the support cylinder has a through-hole. A coupling member is inserted into the through-hole to couple the head and the support cylinder. The transfer device repeats transferring of substrates into and out of the reaction chamber, and substrates are repeatedly placed on the head. The strength of the head is lowered due to the through-hole, and thus there is a possibility that the head is damaged if substrates are repeatedly placed thereon.

SUMMARY OF THE INVENTION

The present invention has been made in view of such circumstances and an object of the present invention is to provide a support pin suppressing damage of the head and a film deposition device having the support pin.

A support pin according to one embodiment of the present invention is disposed in a reaction chamber of a film deposition device forming a film on a substrate and comprises a head supporting the substrate, a support cylinder supporting the head, and a coupling member connecting the head and the support cylinder, wherein the support cylinder is provided with (i) a pair of grooves symmetrical with respect to an axis of the support cylinder, the grooves extending from an edge of the support cylinder along the axis of the support cylinder, and (ii) a pair of first through-holes symmetrical with respect to the axis of the support cylinder, the head comprises (i) a placing part on which the substrate is placed, and (ii) an insertion part protruding from the placing part along the axis of the support cylinder and engaged with the support cylinder, the insertion part has (i) a pair of first portions that are received by end portions of the pair of grooves, and (ii) a second portion that is located inside the support cylinder and is continuous with the pair of first portions, the second portion is provided with a second through-hole, the coupling member passes through the support cylinder and the insertion part via the pair of first through-holes and the second through-hole.

In another embodiment of the present invention, with respect to the cross section perpendicular to the axis of the support cylinder, the shape and size of the second portion is substantially the same as those of inside of the support cylinder, and the pair of first portions protrude radially outward from the second portion.

In another embodiment of the present invention, the insertion part further having a third portion that protrudes from the second portion along the axis of the support cylinder, with respect to the cross section perpendicular to the axis of the support cylinder, the shape and size of the third portion is substantially the same as those of inside of the support cylinder.

In another embodiment of the present invention, the pair of first through-holes are elongated holes which extend along the axis of the support cylinder.

A film deposition device according to one embodiment of the present invention comprises any one of a support pin described above; and a reaction chamber housing the support pin.

According to one embodiment of the present invention, the insertion part has a pair of first portions that are received by end portions of the pair of grooves of the support cylinder. Therefore, the strength of the head is improved.

According to one embodiment of the present invention, in addition to the pair of first portions, the insertion part has a second portion that is located inside the support cylinder and is continuous with the pair of first portions. Therefore, the strength of the head is further improved.

According to one embodiment of the present invention, a step is formed by the pair of first portions and the second portion, and the second portion is inserted into the support cylinder, thereby inhibiting the head from shaking in a radial direction.

According to one embodiment of a support pin and a film deposition device of the present invention, the insertion part has a pair of first portions that are received by end portions of the pair of grooves of the support cylinder. Therefore, the strength of the head can be improved and damage of the head can be inhibited.

DETAILED DESCRIPTION (Embodiment 1)

Figure 1:
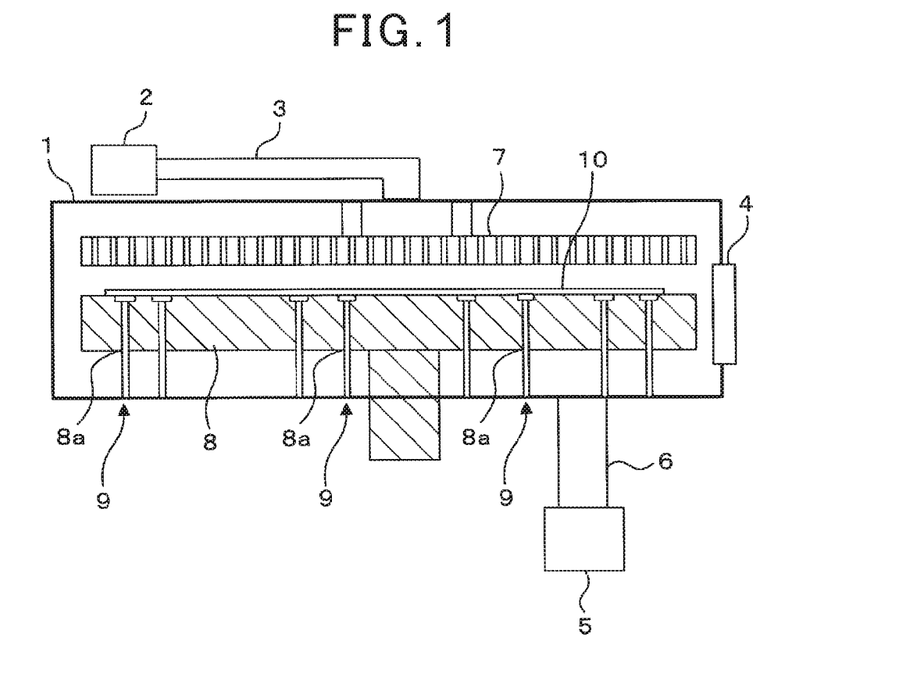
FIG. 1 is a side cross-sectional view schematically showing a configuration of a film deposition device according to Embodiment 1.
Figure 2:
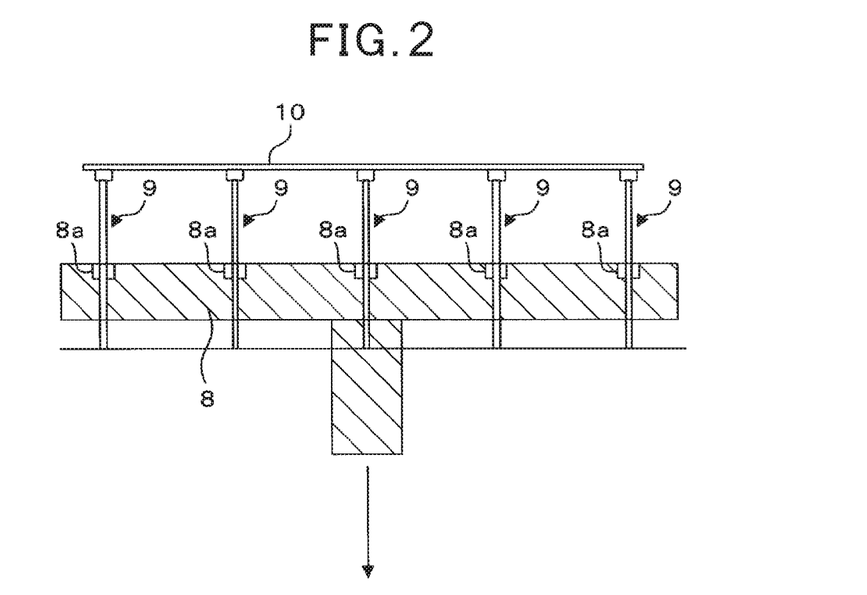
FIG. 2 is a side cross-sectional view schematically showing a susceptor and a support pin.

The present invention will be described below with reference to the drawings showing a film deposition device according to Embodiment 1. FIG. 1 is a cross-sectional side view schematically showing a configuration of the film deposition device. FIG. 2 is a cross-sectional side view schematically showing a susceptor and a support pin.

The film deposition device is provided with a reaction chamber 1. The reaction chamber 1 is connected to a gas supply portion 2 supplying gas for film deposition via a supply pipe 3. A transfer port 4 for transferring a substrate 10 from inside the reaction chamber 1 and to outside the reaction chamber 1 is provided on a lateral surface of the reaction chamber 1. A vacuum pump 5 is connected to the reaction chamber 1 via an exhaust pipe 6.

A diffuser 7 for diffusing gas is provided at an upper part of the reaction chamber 1. The diffuser 7 is connected to the supply pipe 3, and the diffuser 7 also functions as an upper electrode. A plurality of support pins 9 supporting the substrate 10 are erected from the bottom surface of the reaction chamber 1. A susceptor 8 for supporting the substrate 10 is provided below the diffuser 7 in the reaction chamber 1. The susceptor 8 is shaped in a flat plate horizontally extending parallel to the bottom of the reaction chamber. The susceptor 8 has a plurality of pin holes 8a vertically penetrating the susceptor 8. The pin holes 8a have a shape corresponding to the support pins 9. The support pins 9 are inserted into the pin holes 8a. The susceptor 8 is configured to move up and down in a vertical direction. The susceptor 8 also functions as a lower electrode. The diffuser 7 and the susceptor 8 are connected to a voltage application device (not shown) for applying a voltage.

The film deposition process is performed as follows. As shown by an arrow in FIG. 2, when the susceptor 8 is lowered, upper end parts of the support pins 9 are positioned above an upper surface of the susceptor 8. The transfer device (not shown) transfers the substrate 10 in the reaction chamber 1 from the transfer port 4. The support pins 9 support the transferred substrate 10. Then the susceptor 8 is moved upward to support the substrate 10. Gas is supplied into the reaction chamber 1 from the gas supply portion 2 and the voltage application device applies a voltage to the diffuser 7 and the susceptor 8 to form a film on the substrate 10. After the film is formed, gas in the reaction chamber 1 is exhausted by the vacuum pump 5.

Figure 3:
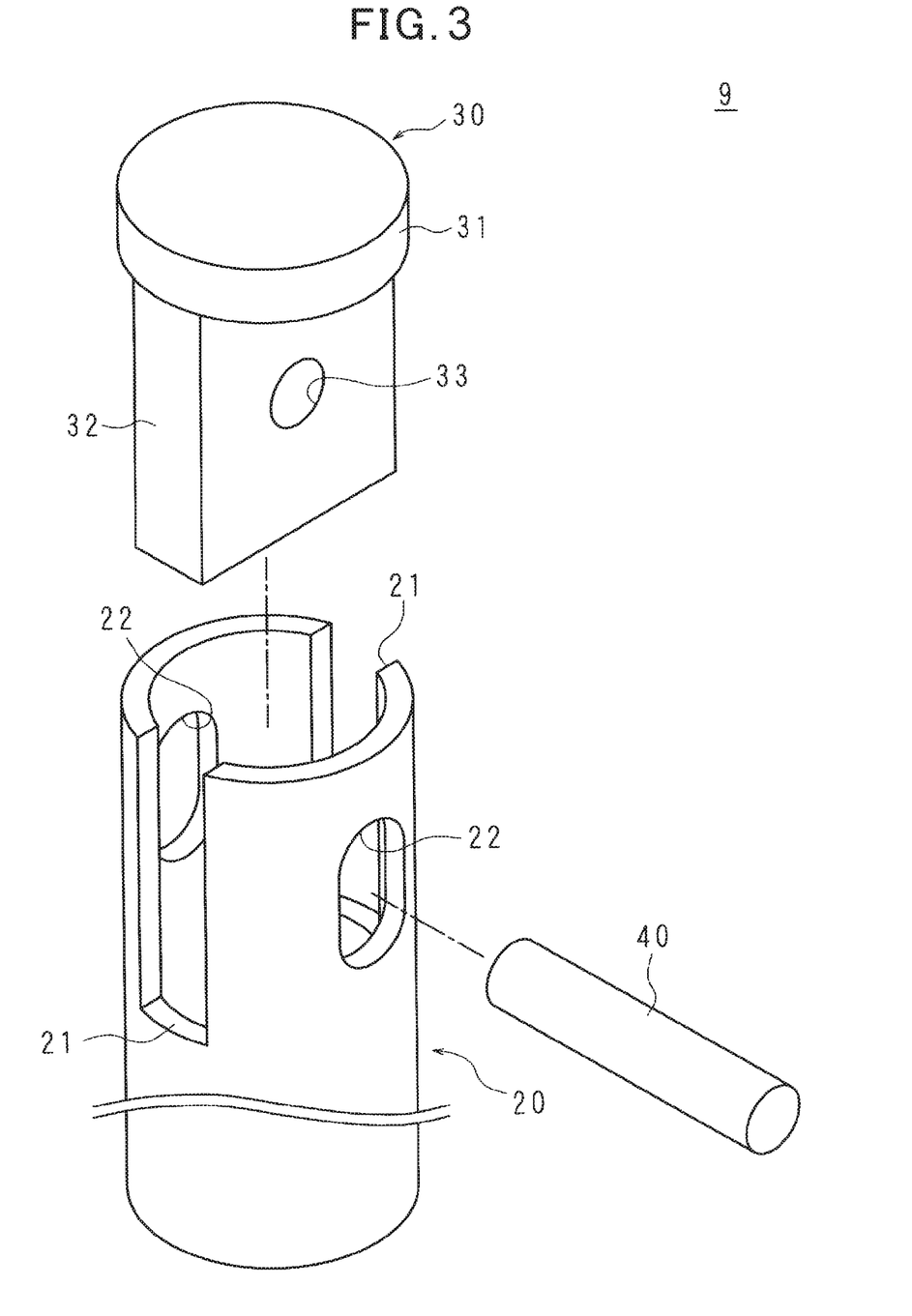
FIG. 3 is an enlarged, exploded perspective view schematically showing a configuration of a support pin.

FIG. 3 is an enlarged, exploded perspective view schematically showing a configuration of the support pin 9. The support pin 9 comprises a support cylinder 20 erected in the reaction chamber 1 and a head 30 supported by an upper end part of the support cylinder 20. A pair of grooves 21, 21 are formed at the upper end part of the support cylinder 20. The pair of grooves 21 are formed along the axis of the support cylinder 20 and symmetrical with respect to the axis of the support cylinder 20. One end of each of the grooves 21 is opened at an edge of the support cylinder 20 and another end (end portion) of the groove 21 is closed. In other words, the groove 21 is opened at an upper end of the support cylinder 20 so that the groove 21 is formed in a substantially U shape. The groove 21 penetrates the circumferential wall of the support cylinder 20 in a radial direction of the support cylinder 20. The pair of grooves 21 are opposed to each other in the radial direction of the support cylinder 20.

The support cylinder 20 has a pair of first through-holes 22, 22 penetrating the circumferential wall of the upper end part of the support cylinder 20 in a radial direction of the support cylinder 20. The pair of first through-holes 22, 22 are elongated holes and extend along the axis of the support cylinder 20. The pair of first through-holes 22, 22 are provided symmetrically with respect to the axis of the support cylinder 20. The first through-hole 22 is disposed in a position rotated by approximately 90 degrees around the axis of the support cylinder 20 from the groove 21. The pair of first through-holes 22, 22 are opposed to each other in the radial direction of the support cylinder 20. The pair of grooves 21, 21 and the pair of first through-holes 22, 22 are alternately provided every 90 degrees around the axis of the support cylinder 20.

The head 30 comprises a disk-shaped placing part 31 having a first surface on which the substrate 10 is placed and a plate-shaped insertion part 32 protruding along the axis of the support cylinder 20 from a second surface opposite to the first surface of the placing part 31. The insertion part 32 is engaged with the support cylinder 20. The outer diameter of the disk-shaped placing part 31 is equal to or larger than the outer diameter of the support cylinder 20. With respect to the cross section perpendicular to the axis of the support cylinder 20, the length of the insertion part 32 in a direction connecting the pair of grooves 21, 21 is equal to or shorter than the outer diameter of the disk-shaped placing part 31 and substantially same as the outer diameter of the support cylinder 20. In other words, the insertion part 32 has a pair of first portions that are received by end portions of the pair of grooves and a second portion that is located inside the support cylinder 20 and is continuous with the pair of first portions. In the embodiment, the plate-shaped insertion part 32 has the pair of first portions which are engaged with the pair of grooves 21, 21 and the second portion disposed between the pair of first portions in the direction connecting the pair of grooves 21, 21. It should be noted that the pair of first portions may be protruded outward from the peripheral surface of the placing part 31.

A dimension of the insertion part 32 in the axial direction of the support cylinder 20 is substantially same as a dimension (depth) of the groove 21 along the axis of the support cylinder 20. The second portion of the insertion part 32 has a second through-hole 33. A position of the second through-hole 33 corresponds to a position of the first through-hole 22. The pair of first through-holes 22 and the second through-hole 33 are aligned so that one of the pair of first through-holes 22 communicates with another of the pair of first through-holes 22 via the second through-hole 33.

The insertion part 32 is inserted into the groove 21 so that a position of the through-hole 33 and the position of first through-hole 22 correspond. A coupling member 40 is inserted into the pair of first through-holes 22, 22 and the second through-hole 33, passing through the support cylinder 20 and the insertion part 32. The coupling member 40 may be, for example, made of aluminum, and may be formed in a rod shape. The end parts of the coupling member 40 projected from the pair of first through-holes 22, 22 are calked, thereby coupling the head 30 and the support cylinder 20. It should be noted that the position of the second through-hole 33 in the axial direction of the support cylinder 20 may vary in each head 30 within the range of dimensional tolerance. However, because the pair of first through-holes 22, 22 penetrating the support cylinder 20 are elongated holes which extend along the axis of the support cylinder 20, it is prevented that the position displacement of the second through-hole 33 within the dimensional tolerance affects the assembly of the head 30 and the support cylinder 20.

With respect to the cross section perpendicular to the axis of the support cylinder 20, the outer surfaces of the pair of first portions of the insertion part 32 are located radially outward with respect to the inner surface of the support cylinder 20. Therefore, a sectional area, cutting parallel to the first surface of the placing part 31, of the insertion part 32 around the second through-hole 33 (hereinafter referred to as cross-sectional area) is larger than that in the case where the dimension of the insertion part 32 is set to be equal to or smaller than the inner diameter of the support cylinder 20. Thus, in the embodiment, the strength of the head 30 can be improved, and the damage of the head 30 can be inhibited. It should be noted that a rib for reinforcement may be provided between the placing part 31 and the insertion part 32.

(Embodiment 2)

Figure 4:
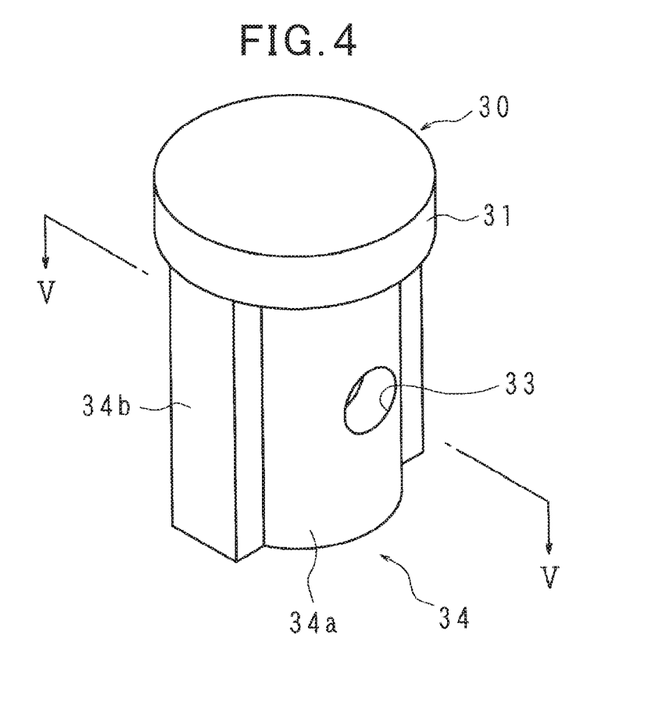
FIG. 4 is an enlarged, exploded perspective view schematically showing a configuration of a head of a film deposition device according to Embodiment 2.
Figure 5:
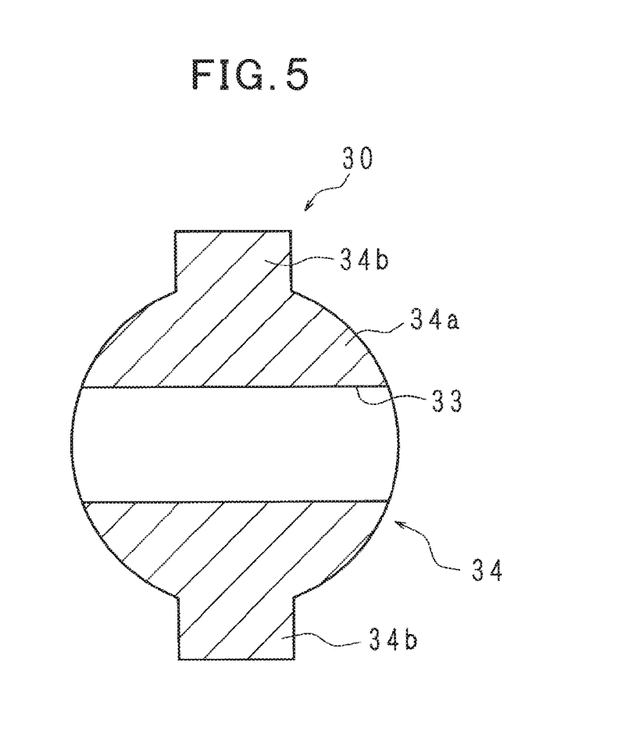
FIG. 5 is a schematic cross-sectional view taken along the line V-V of FIG. 4.

Another embodiment of the present invention will be described below with reference to the drawings showing a film deposition device according to Embodiment 2. FIG. 4 is an enlarged, exploded perspective view schematically showing a configuration of the head 30. FIG. 5 is a schematic cross-sectional view taken along the line V-V in FIG. 4. An insertion part 34 has a pair of first portions 34b, 34b that are received by end portions of the pair of grooves 21, 21 and a second portion 34a that is located inside the support cylinder 20 and is continuous with the pair of first portions 34b, 34b. The second portion 34a protrudes from the second surface of the placing part 31 in the axial direction with a dimension in the radial direction of the support cylinder 20 corresponding to the inner diameter of the support cylinder 20. In the embodiment, the second portion 34a is shaped in a column with a diameter substantially same as the inner diameter of the support cylinder 20. The pair of first portions 34b, 34b are formed in a rectangular parallelepiped shape protruding radially outward from the circumference surface of the second portion 34a. The pair of first portions 34b, 34b protrude respectively in the opposite radial directions of the support cylinder 20. The dimension between the outer surfaces of the pair of first portions 34b, 34b is substantially same as the outer diameter of the support cylinder 20. The second portion 34a has a second through-hole 33 penetrating the second portion 34a in a radial direction of the support cylinder 20.

The second through-hole 33 is formed in a position rotated by approximately 90 degrees around the axis of the support cylinder 20 from the first portion 34b. A position of the second through-hole 33 corresponds to a position of the first through-hole 22. The pair of first portions 34b, 34b are inserted into the grooves 21, 21 so that the position of the second through-hole 33 and the position of the first through-hole 22 correspond. The second portion 34a is inserted inside the inner circumference of the support cylinder 20. The coupling member 40 is inserted into the pair of first through-holes 22 and the second through-hole 33.

In addition to the pair of first portions 34b, the insertion part 34 has the second portion 34a. With respect to the cross section perpendicular to the axis of the support cylinder 20, the shape and size of the second portion 34a is substantially the same as those of inside of the support cylinder 20. Therefore, a cross-sectional area of the insertion part 34 around the second through-hole 33 becomes even larger, and thus further improvement of the strength of the head 30 is possible. In the embodiment, the second portion 34a is formed in a circular column and the dimension of the second portion 34a in a radial direction of the support cylinder 20 corresponds to the inner diameter of the support cylinder 20. However, the shape of the second portion 34a is not limited to circular column. It should be noted that a rib for reinforcement may be provided between the placing part 31 and the second portion 34a.

In the film deposition device according to Embodiment 2, components with the same configurations as those in Embodiment 1 are denoted by the same reference signs, and detailed description thereof are omitted.

(Embodiment 3)

Figure 6:
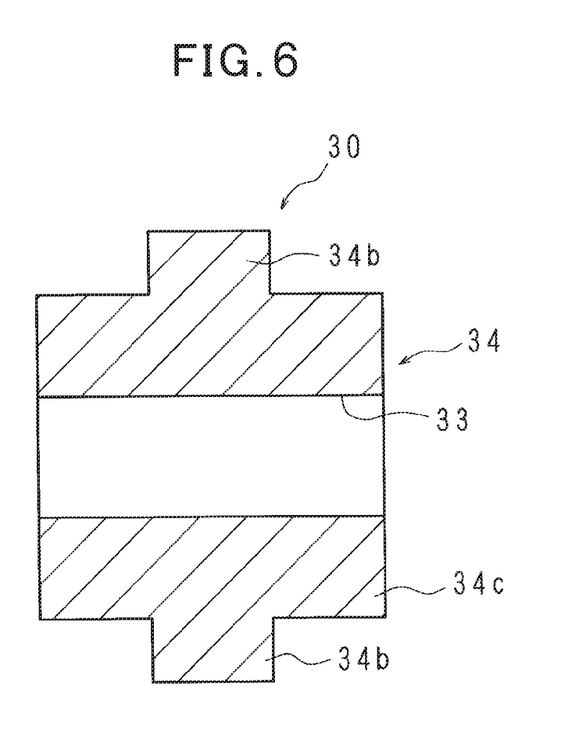
FIG. 6 is a schematic cross-sectional view of an insertion part of a film deposition device according to Embodiment 3.

Another embodiment of the present invention will be described below with reference to the drawings showing a film deposition device according to embodiment 3. FIG. 6 is a schematic cross-sectional view of an insertion part 34. When the inner circumference of the support cylinder 20 is formed in a rectangular shape in a plan view, as shown in FIG. 6, a second portion 34c is also formed in a rectangular shape in a plan view. It should be noted that, if the cross-sectional area of the insertion part 34 is aimed to be larger than that of FIG. 5, the support pin 9 may be designed so that a rectangular formed by the second portion 34c in the cross section as in FIG. 6 circumscribes a circle formed by the second portion 34a in the cross section as in FIG. 5.

In the film deposition device according to Embodiment 3, components with the same configurations as those in Embodiment 1 and 2 are denoted by the same reference signs, and detailed description thereof are omitted.

(Embodiment 4)

Figure 7:
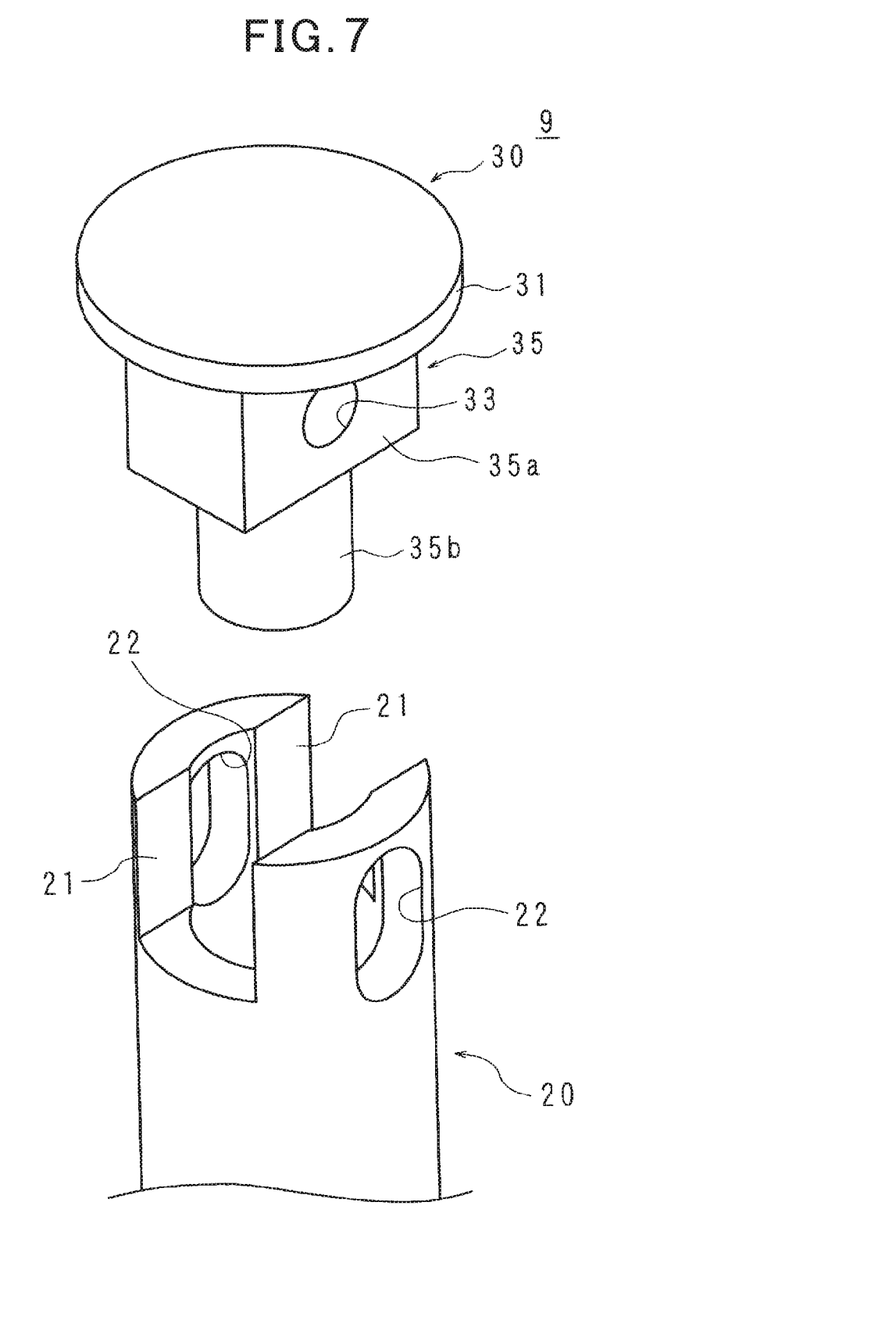
FIG. 7 is a partially enlarged, exploded perspective view schematically showing a support pin of a film deposition device according to Embodiment 4.
Figure 8:
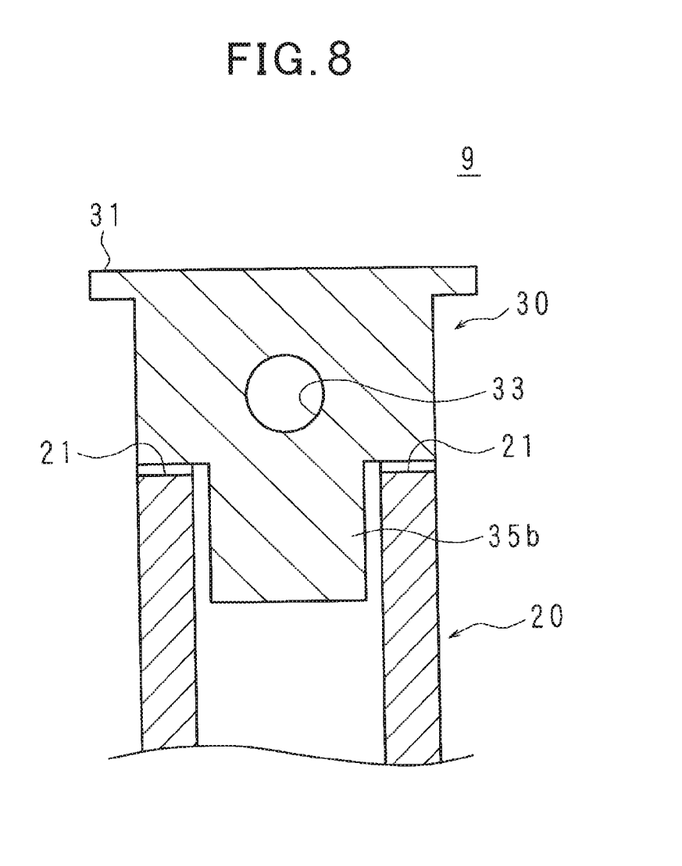
FIG. 8 is a partially enlarged, longitudinal sectional view schematically showing a support pin.

Another embodiment of the present invention will be described below with reference to the drawings showing a film deposition device according to embodiment 4. FIG. 7 is a partially enlarged, exploded perspective view schematically showing a support pin 9. FIG. 8 is a partially enlarged, longitudinal sectional view schematically showing the support pin 9. It should be noted that in FIGS. 7 and 8, the description of the coupling member 40 is omitted.

An insertion part 35 has an engagement part 35a engaging with the pair of grooves 21, 21 in the shape of a plate protruding from the second surface of the placing part 31. The engagement part 35a corresponds to the insertion part 32 shown in FIG. 3. As well as the insertion part 32 shown in FIG. 3, the engagement part 35a has a pair of first portions that are received by end portions of the pair of grooves 21, 21 and a second portion that is located inside the support cylinder 20 and is continuous with the pair of first portions. Since the configurations of the pair of first portions and the second portion of the engagement part 35a may be the same as those of the pair of first portions and the second portion of the insertion part 32 shown in FIG. 3, the detail explanation thereof is omitted. The insertion part 35 has a third portion 35b in the shape of a column protruding from the second portion of the engagement part 35a along the axis of the support cylinder 20. The engagement part 35a is disposed between the placing part 31 and the third portion 35b in the axial direction of the support cylinder 20. The dimension between the outer surfaces of the pair of first portions of the engagement part 35a is substantially same as the outer diameter of the support cylinder 20, and the outer diameter of the third portion 35b is substantially the same as the inner diameter of the support cylinder 20. A step is formed by the pair of first portions of the engagement part 35a and the third portion 35b.

The second portion of the engagement part 35a has a second through-hole 33. A position of the second through-hole 33 corresponds to positions of the pair of first through-holes 22, 22. The third portion 35b is inserted inside the inner circumference of the support cylinder 20 so that a position of the second through-hole 33 and the position of the first through-hole 22 correspond and the first portion of the engagement part 35a is inserted into a groove 21. The coupling member 40 is inserted into the pair of first through-holes 22, 22 and the second through-hole 33. With respect to the cross section perpendicular to the axis of the support cylinder 20, the shape and size of the third portion 35b is substantially the same as those of inside of the support cylinder 20. In the embodiment, the third portion 35b is formed in a circular column and the dimension of the third portion 35b in a radial direction of the support cylinder 20 corresponds to the inner diameter of the support cylinder 20. However, the shape of the third portion 35b is not limited to circular column.

The first portion of the engagement part 35a and the third portion 35b form the step, and the third portion 35b is inserted into the support cylinder 20, thereby inhibiting the head 30 from shaking in a radial direction.

In the film deposition device according to Embodiment 4, components with the same configurations as those in Embodiment 1 to 3 are denoted by the same reference signs, and detailed description thereof are omitted.

The embodiments disclosed herein are exemplary in all respects, and should not be construed as limiting. The technical features described in each embodiment can be combined with each other and the scope of the present invention is intended to include all changes within the feature of the claims, and the equivalents thereof.

What is claimed is:

1. A support pin disposed in a reaction chamber of a film deposition device forming a film on a substrate, comprising:
    a head supporting the substrate;
    a support cylinder supporting the head; and
    a coupling member connecting the head and the support cylinder, wherein
    the support cylinder is provided with
        (i) a pair of grooves symmetrical with respect to an axis of the support cylinder, the grooves extending from an edge of the support cylinder along the axis of the support cylinder, and
        (ii) a pair of first through-holes symmetrical with respect to the axis of the support cylinder,
    the pair of grooves and the pair of first through-holes are alternately provided around the axis of the support cylinder,
    the head comprises
        (i) a placing part on which the substrate is placed, and
        (ii) an insertion part protruding from the placing part along the axis of the support cylinder and engaged with the support cylinder,
    the insertion part has
        (i) a pair of first portions that are received by end portions of the pair of grooves, and
        (ii) a second portion that is located inside the support cylinder and is continuous with the pair of first portions,
    the second portion is provided with a second through-hole,
    the coupling member passes through the support cylinder and the insertion part via the pair of first through-holes and the second through-hole, and
    with respect to the cross section perpendicular to the axis of the support cylinder around the second through-hole, outer surfaces of the pair of first portions of the insertion part are located radially outward with respect to an inner surface of the support cylinder and a dimension between the outer surfaces of the pair of first portions of the insertion part is longer than a dimension of the insertion part in a direction in which the coupling member passes through the support cylinder and the insertion part.

2. The support pin according to claim 1, wherein
    with respect to a cross section perpendicular to the axis of the support cylinder, a shape and a size of the second portion is substantially the same as those of inside of the support cylinder, and
    the pair of first portions protrude radially outward from the second portion.

3. The support pin according to claim 1, wherein
    the insertion part further having a third portion that protrudes from the second portion along the axis of the support cylinder,
    with respect to a cross section perpendicular to the axis of the support cylinder, a shape and a size of the third portion is substantially the same as those of inside of the support cylinder.

4. The support pin according to claim 1, wherein
    the pair of first through-holes are elongated holes which extend along the axis of the support cylinder.

5. A film deposition device, comprising:
    a support pin according to claim 1; and
    a reaction chamber housing the support pin.

6. The film deposition device according to claim 5, wherein
    with respect to a cross section perpendicular to the axis, a shape and a size of the second portion is substantially the same as those of inside of the support cylinder, and
    the pair of first portions protrude radially outward from the second portion.

7. The film deposition device according to claim 5, wherein
    the insertion part further having a third portion that protrudes from the second portion along the axis of the support cylinder,
    with respect to a cross section perpendicular to the axis, a shape and a size of the third portion is substantially the same as those of inside of the support cylinder.

8. The film deposition device according to claim 5, wherein
    the pair of first through-holes are elongated holes which extend along the axis of the support cylinder.

9. The support pin according to claim 1, wherein a dimension of the insertion part in the axial direction of the support cylinder is substantially same as a dimension of the pair of grooves along the axis of the support cylinder.

10. The support pin according to claim 1, wherein the insertion part is in the shape of plate.

11. The support pin according to claim 1, wherein the second portion is shaped in a column with a diameter substantially same as an inner diameter of the support cylinder, and the pair of first portions are formed in a rectangular parallelepiped shape protruding radially outward from the circumference surface of the second portion.

12. The support pin according to claim 3, wherein the insertion part has an engagement part engaging with the pair of grooves, the engagement part is in the shape of plate and includes the pair of first portions and the second portion, and the third portion is in the shape of a column protruding from the second portion of the engagement part along the axis of the support cylinder.

13. The film deposition device according to claim 5, wherein a dimension of the insertion part in the axial direction of the support cylinder is substantially same as a dimension of the pair of grooves along the axis of the support cylinder.

14. The film deposition device according to claim 5, wherein the insertion part is in a shape of plate.

15. The film deposition device according to claim 5, wherein the second portion is shaped in a column with a diameter substantially same as the inner diameter of the support cylinder, and the pair of first portions are formed in a rectangular parallelepiped shape protruding radially outward from the circumference surface of the second portion.

16. The film deposition device according to claim 7, wherein the insertion part has an engagement part engaging with the pair of grooves, the engagement part is in the shape of plate and includes the pair of first portions and the second portion, and the third portion is in the shape of a column protruding from the second portion of the engagement part along the axis of the support cylinder.

* * * * *